United States Patent [19]
Taya

[11] Patent Number: 5,291,016
[45] Date of Patent: Mar. 1, 1994

[54] ELECTROSTATIC LENS ARRANGEMENT OF MULTI-STAGES OF MULTI-POLE ELECTRODES AND MASS SPECTROMETER USING THE SAME

[75] Inventor: Shunroku Taya, Mito, Japan
[73] Assignee: Hitachi, Ltd., Tokyo, Japan
[21] Appl. No.: 9,006
[22] Filed: Jan. 26, 1993

[30] Foreign Application Priority Data
Jan. 28, 1992 [JP] Japan .................. 4-012921

[51] Int. Cl.⁵ ............................. H01J 49/42
[52] U.S. Cl. ........................ 250/292; 250/396 R
[58] Field of Search ............ 250/292, 290, 396 R; 313/268, 289, 299, 300, 292, 361.1

[56] References Cited
U.S. PATENT DOCUMENTS

| | | | |
|---|---|---|---|
| 3,376,449 | 4/1968 | Harrison | 250/396 |
| 3,717,785 | 2/1973 | Guerinet | 250/396 |
| 4,553,029 | 11/1985 | Matsuda | 250/296 |

FOREIGN PATENT DOCUMENTS

| | | |
|---|---|---|
| 59-500642 | 4/1984 | Japan . |
| 59-215650 | 12/1984 | Japan . |
| 2-257558 | 10/1990 | Japan . |
| 2-270256 | 11/1990 | Japan . |

*Primary Examiner*—Jack I. Berman
*Attorney, Agent, or Firm*—Antonelli, Terry, Stout & Kraus

[57] ABSTRACT

An electrostatic lens arrangement of three stages of quadrupole electrodes comprising first, second and third stage electrostatic lens unit connected in series, each electrostatic lens unit including first, second, third and fourth electrode arranged around a circle surrounding a center axis of an ion beam passage with an equal interval of 90° C., wherein the respective first, second, third and fourth electrodes for the first, second and third stage electrostatic lens unit are respectively supported by first, second, third and fourth common supporting rod along respective straight lines while electrically insulating each other.

8 Claims, 3 Drawing Sheets

ELECTROSTATIC LENS ARRANGEMENT OF MULTI-STAGES OF MULTI-POLE ELECTRODES AND MASS SPECTROMETER USING THE SAME

BACKGROUND OF THE INVENTION

1. Field of the Invention

The present invention relates to a multi-stage multi-pole electrode arrangement used for an electrostatic lens system which converges a beam of electric charges and is applied, for example, to a corpuscular ray accelerator, mass spectrometer and ion beam analyzer.

2. Description of Related Art

As disclosed in JP-A-59-215650 (1984) which corresponds to U.S. Pat. No. 4,553,029, in a double convergence mass spectrometer an electrostatic lens unit of quadrupole electrode system is widely used as a measure for converging charged particles or ion beam and when no sufficient convergence is obtained with such electrostatic lens unit of a single stage, a plurality of such electrostatic lens units are used and arranged in two or three stages in series to obtain a required convergence.

FIG. 4 is a perspective view showing one example of conventional electrostatic lens arrangements of muliti-stage multi-pole electrode system.

The illustrated conventional electrostatic lens arrangement relates a three stage quadrupole electrode system wherein a first stage quadrupole lens unit 1A, a second stage quadrupole lens unit 1B and a third stage quadrupole lens unit 1C, each of which is constructed independently, are accomodated in series within a cylindrical casing 2.

In each of the electrostatic lens units of multi-pole electrode system for the respective stages four rod shaped electrodes 3, wherein four electrodes 3A for the first stage, four electrodes 3B for the second stage and four electrodes 3C for the third stage, which are generally called as electrodes 3, are arranged in parallel around a circumference surrounding a passage of the charged beam with an equal interval of 90° and rods 4' for supporting the electrodes 3 are inserted through the respective electrodes 3 in the axial direction at the center thereof. At both axial ends of the respective quadrupole electrodes disks 5-1 and 5-2 are disposed opposing each other and both ends of the supporting rods 4' for the respective electrodes 3 are secured to the respective disks 5-1 and 5-2, and further the respective disks 5-1 and 5-2 are provided with a beam passage aperture 6.

Further, conventional electrostatic lens arrangements of multi-pole electrode system are also disclosed in JP(PCT)-A-59-500642 (1984) which corresponds to WO-A-83/03498, JP-A-2-257558 (1990) and JP-A-2-270256 (1990).

The conventional electrostatic lens arrangements of multi-stage multi-pole electrode system as explained above are constituted by combining a plurality of independent electrostatic lens units of multi-pole electrode system one by one in series, therefore such conventional electrostatic lens arrangements had the following drawbacks to be improved.

(1) When constituting an electrostatic lens arrangement of multi-stage it is necessary to assemble the multi-pole electrodes for the respective stages in such a manner that the center axes of the corresponding electrodes for the respective stages coincide each other and align straight lines in order to eliminate offsetting of axes of the respective electrostatic lens units, however the supporting rods for the electrodes for the respective electrostatic lens units are independent, it is difficult to coincide the axes of the corresponding electrodes for the respective stages with a high accuracy. When there arises an error in axis coincidence with the corresponding electrodes an aberration due to axis offsetting in electrostatic lens units with respect to the charged beam is generated and a convergence estimated according to a theory can not be achieved.

(2) Further, an electrostatic lens arrangement of multi-pole electrode system for n stages requires n time larger number of parts than that required for a single stage, therefore the time for assembling the same as well as the cost therefor increase.

SUMMARY OF THE INVENTION

The present invention has been done in view of the above and an object of the present invention is to provide an electrostatic lens arrangement of multi-stage multi-pole electrode system having a simple structure and a high accuracy and further, a mass spectrometer using the same.

For achieving the above object, in the electrostatic lens arrangement of multi-stage multi-pole electrode system according to the present invention which is constituted by arranging a plurality of multi-pole electrode units in series, the respective corresponding electrodes for respective stages arranged in series on straight lines are supported by respective common rods, and the respective electrodes are electrically insulated each other and from the respective common supporting rods supporting the same and are adapted to be applied of independent electrical potentials.

With the above constitution according to the present invention, the corresponding electrodes arranged in series for the respective stages in the electrostatic lens arrangement of multi-stage multi-pole electrode system are supported in straight lines by common supporting rods with a high accuracy, thereby the axis offsetting of the electrostatic lens units as well as the concurrent aberration are remarkably reduced.

Further, since the common supporting rods for supporting the respective electrodes are used, number of parts for the electrostatic lens arrangement is reduced and the assembly work therefor is facilitated.

BRIEF DESCRIPTION OF THE DRAWINGS

FIG. 1 (b) is a front view of the first embodiment seen from the direction of arrow A in FIG. 1 (a);

DESCRIPTION OF THE PREFERRED EMBODIMENTS

Embodiments according to the present invention are explained with reference to FIG. 1 (a) through FIG. 3.

Figure 1A:
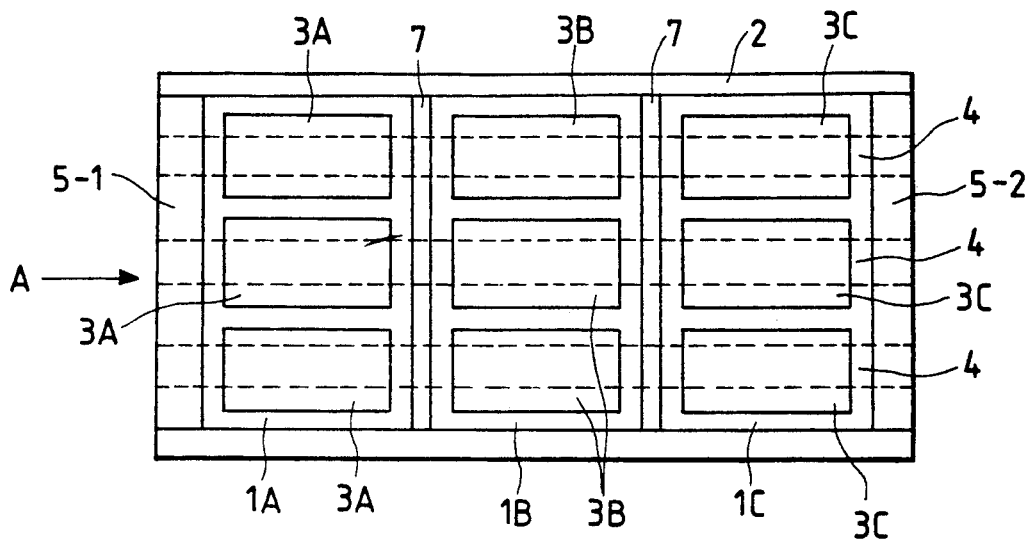
FIG. 1 (a) is a side view of a first embodiment of electrostatic lens arrangements of multi-stage multi-pole electrode system according to the present invention.
Figure 1B:
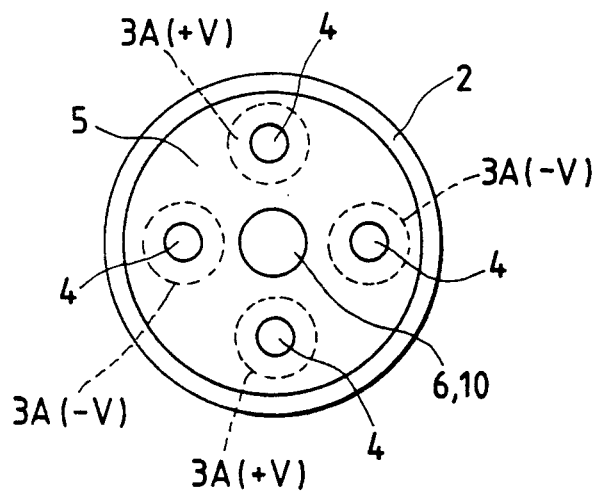
Figure 4:
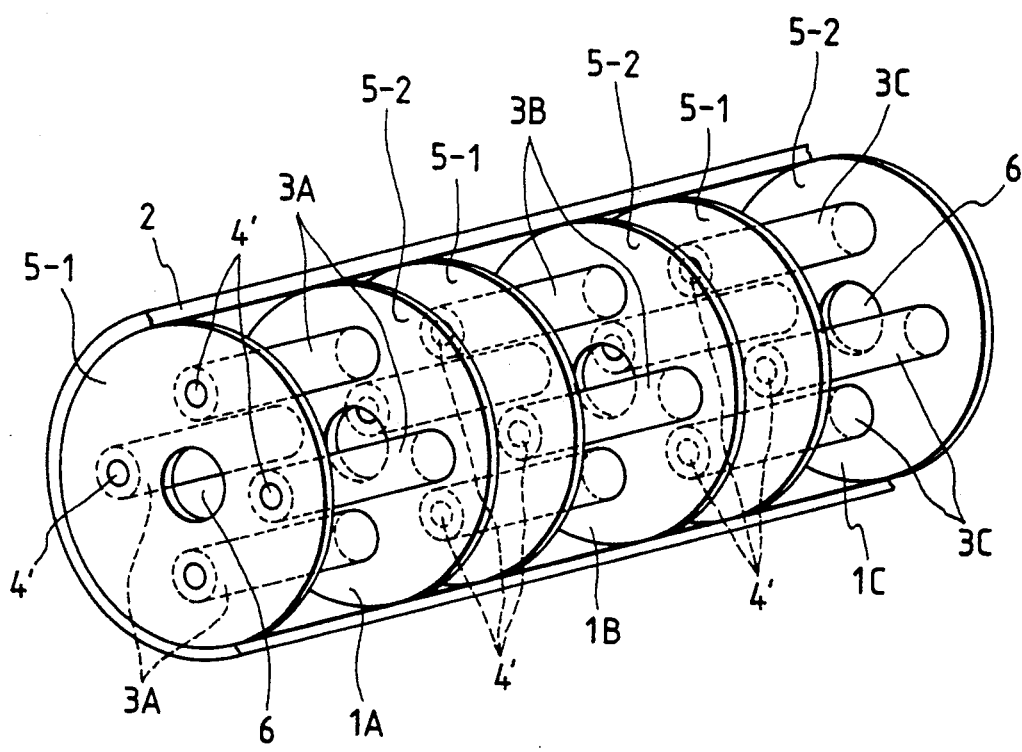
FIG. 4 is a perspective view illustrating an example of conventional electrostatic lens arrangements of multi-stage multi-pole electrode system.

FIG. 1 (a) and FIG. 1 (b) show one embodiment of electrostatic lens arrangements of multi-stage multi-pole electrode system according to the present invention in a form of an electrostatic lens arrangement of three-stage quadrupole electrode system, wherein FIG. 1 (a) shows a side view thereof and FIG. 1 (b) shows a front view thereof seen from the arrowed direction A in FIG. 1 (a). In the drawings the same numerals used for the conventional example as illustrated in FIG. 4 denote the same or equivalent elements as those in FIG. 4.

Three electrostatic lens units 1A, 1B and 1C of quadrupole electrode system for the first stage, second stage and third stage are arranged is series within a casing 2. Between the electrostatic lens unit 1A for the first stage and the electrostatic lens unit 1B for the second stage and between the electrostatic lens unit 1B for the second stage and the electrostatic lens unit 1C for the third stage shielding disks 7 having a charged beam passage apertures 10 are interposed respectively. The electrostatic lens unit 1A for the first stage is composed of four electrodes 3A arranged around a circumference surrounding a charged beam passage with an equal interval of 90° the electrostatic lens unit 1B for the second stage also composed of four electrodes 3B arranged around the circumference surrounding the charged beam passage with an equal interval of 90° and the electrostatic lens unit 1C for the third stage is also composed of four electrodes 3C arranged around the circumference surrounding the charged beam passage with an equal interval of 90°. The respective three electrodes 3A, 3B and 3C for the first, second and third stages aligned on same straight lines are supported by common supporting rods 4 which pass through the respective center axes of the respective electrodes 3A, 3B and 3C and through correspondingly formed apertures in the shielding disks 7. The four common supporting rods 4 are held by and secured to disks 5-1 and 5-2 having a charged beam passage 6 and disposed at both ends of the cylindrical casing 2 by means of a securing means such as screws or press fitting. The shielding disks 7 interposed between the respective electrostatic lens units serves for positioning and supporting the common supporting rods 4 as well as for suppressing scattering particles from the electrodes and for shielding electric field extending beyond the edges of the electrodes.

The common supporting rods 4 are made of an insulating material such as alumina, and the electrodes 3A, 3B and 3C for the respective stages aligned on a straight line and supported by a common supporting rod 4 are electrically insulated from each other, thereby independent electrical potentials can be applied to the respective electrodes 3A, 3B and 3C aligned on a straight line.

The electrostatic lens arrangement of multi-stage multi-pole electrode system having the above constitution is assembled as follows.

At first, the electrodes 3A, 3B and 3C for the respective stages in the electrostatic lens arrangement of the quadrupole electrode system and the shielding disks 7 are inserted and installed on respective common supporting rods 4, the assembled members are then inserted from one end of the casing 2, thereafter the disks 5-1 and 5-2 are installed to both ends of the cylindrical casing 2 while fitting and securing both ends of the respective common supporting rods 4 into installation holes formed in the respective disks 5-1 and 5-2.

According to the present embodiment, the corresponding electrodes 3A, 3B and 3C for the respective stages in the electrostatic lens arrangement of multi-stage multi-pole electrode system are arranged in series on the respective common supporting rods 4 in straight lines with no axis offsetting. As a result, axis offsetting of the electrostatic lens units for the respective stages is reduced thereby, the generation of aberration in the electrostatic lens arrangement is minimized.

Further, since the common supporting rods 4 are used, the number of parts for the electrostatic lens arrangement of multi-stage multi-pole electrode system is reduced, and the structure is simplified as well as the assembling of the arrangement in total is facilitated. For instance, when comparing the present embodiment with the conventional arrangement as illustrated in FIG. 4 with respect to the number of parts, the number of parts reduces from 31 to 21, in that in the present embodiment the arrangement is assembled with a smaller number of parts by 10 in comparison with the conventional arrangement.

Figure 2:
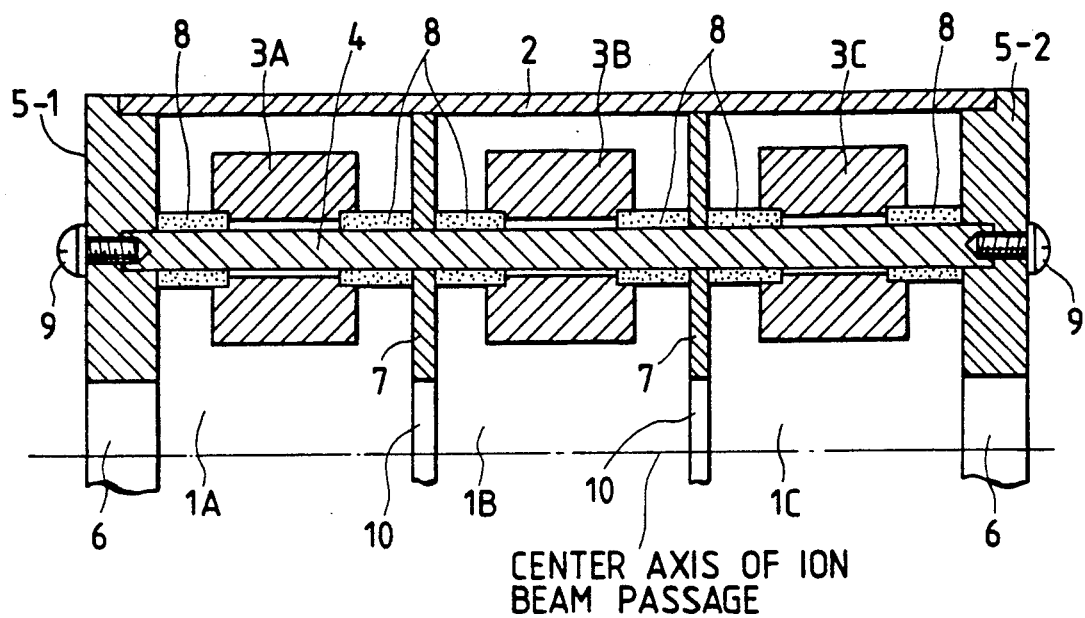
FIG. 2 is a partial cross sectional view of a second embodiment of electrostatic lens arrangements of multi-stage multi-pole electrode system according to the present invention.

FIG. 2 is a partial cross sectional view of a second embodiment according to the present invention.

The present embodiment also relates to an electrostatic lens arrangement of three stage quadrupole electrode system. In the present embodiment like the first embodiment, the respective corresponding electrodes 3A, 3B and 3C in the electrostatic lens units of multi-pole electrode system 1A, 1B and 1C for the respective stages are supported by the common supporting rods 4 via through holes formed in the electrodes extending in axial direction at the center thereof. However, the common supporting rods 4 are made of a metallic material, in that a conductive material unlike the first embodiment, such that the common supporting rods 4 are inserted into the through holes of the respective electrodes 3A, 3B and 3C via electrically insulated sleeves 8. Both ends of the respective common supporting rods 4 are fitted in respective positioning holes formed on the disks 5-1 and 5-2 and are fixed by screws 9.

With the present embodiment, substantially the same advantages as those obtained with the first embodiment are obtained.

Further, in the above embodiments, examples of electrostatic lens arrangements of three stage quadrupole electrode system are illustrated, the present invention is applicable to any number of stages as well as any number of multi-pole electrodes such as to sextupole electrodes and octopole electrodes.

Figure 3:
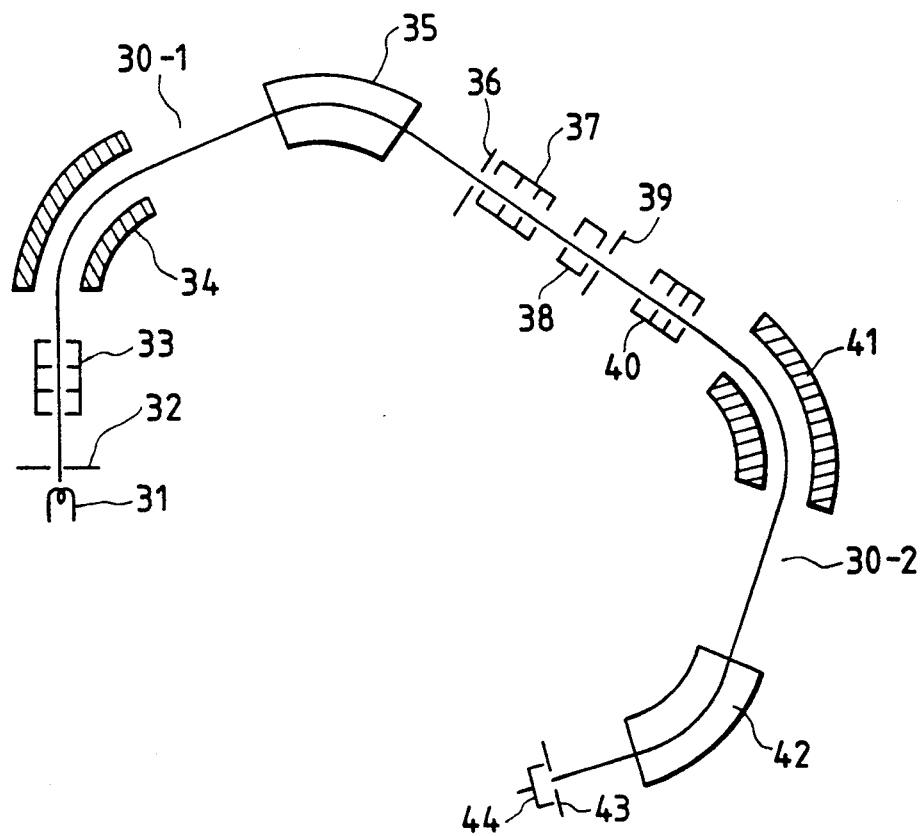
FIG. 3 is an explanatory view of a tandem type mass spectrometer which incorporates either the first or second embodiment as illustrated in FIGS. 1 (a) and FIG. 1 (b), and FIG. 2.

FIG. 3 is a schematic diagram of an application example of the present invention in which one of the electrostatic lens arrangements of multi-stage multi-pole electrode system according to the above embodiments is applied for a convergence use electrostatic lens arrangement in a tandem type mass spectrometer.

In FIG. 3, a first double convergence mass spectrometer 30-1 is constituted by disposing an ion source 31, an ion source slit 32, an electrostatic lens of quadrupole electrode system 33, a sectorial magnetic field 34, a sectorial electric field 35 and a collector slit 36 along an ion beam passage in the named order, and a second double convergence mass spectrometer 30-2 are also constituted by disposing a source slit 39, an electrostatic lens of quadrupole electrode system 40, a sectorial magnetic field 41, a sectorial electric field 42, a detector slit 43 and an ion detector 44 along the ion beam passage in the named order.

The first and second double convergence mass spectrometers 30-1 and 30-2 are optically connected in series by an interface element constituted by an electrostatic lens 37 of quadrupole electrode system and a bombardment chamber 38. The electrostatic lenses 33 and 40 of quadrupole electrode system disposed respectively between the ion source slit 32 and the uniform magnetic field 34 and between the source slit 39 and the uniform magnetic field 41 function to converge the passing beam of ions in a direction perpendicular to the plane of the orbit of the beam, and the electrostatic lens 37 of quadrupole electrode system in the interface functions to converge the passing beam of ions in a direction parallel to the plane of the orbit of the beam.

In such tandem type mass spectrometer, predetermined parent ions are selected in the first stage double convergence mass spectrometer 30-1, thereafter the selected parent ions are dissociated in the gas bombardment chamber 38 to produce daughter ions and the daughter ions thus produced are analyzed in the second stage double convergence mass spectrometer 30-2 with a high resolution.

In case when electrostatic lens arrangement of multi-stage quadrupole electrode system is required for the electrostatic lenses 33, 37 and 40 of quadrupole electrode system in the above application example, and the electrostatic lens arrangement of multi-stage multi-pole electrode system according to one of the first and second embodiments, in which the respective electrodes for the multi-stages disposed in series are supported by the respective common supporting rods, is applied, aberration due to axis offsetting of the electrostatic lens units is reduced and a mass spectrometor having a high acceracy is realized.

Further, for a single mass spectrometer other than the above tandem type mass spectrometer which requires an electrostatic lens of quadrupole electrode system in the ion beam passage such as between an ion source and a uniform magnetic field and between a magnetic field and electric field, the above electrostatic lens arrangement of multi-stage multi-pole electrode system using the common supporting rods for the electrodes disposed in straight lines can be also used.

According to the present invention thus explained, with the provision of the common supporting rods which support serially disposed electrodes for the respective stages in the electrostatic lens arrangement of multi-stage multi-pole electrode system, an assembly accuracy of the electrostatic lens arrangement is increased, thereby offsetting of the center axes of electrostatic lens units of multi-pole electrode system for respective stages is minimized as well as aberration caused by the axis offsetting is minimized. Further the total number of parts for the electrostatic lens arrangement of multi-stage multi-pole electrode system is remarkably reduced in comparison with that for the conventional arrangement, easiness of assembly work thereof is enhanced and the production cost thereof is also reduced.

Further, when the electrostatic lens arrangement according to the present invention is applied for a single or tandem type mass spectrometer, application devices having a high analysis accuracy is realized.

I claim:

1. An electrostatic lens arrangement of multi-stages of multi-pole electrodes comprising:

a first electrostatic lens unit including a first, second, third and fourth electrode arranged around a circle surrounding a center axis of an ion beam passage with a same interval;

a second electrostatic lens unit including a first, second, third and fourth electrode arranged around the same circle surrounding the center axis of the ion beam passage with the same interval;

a cylindrical casing accommodating said first and second electrostatic lens unit in series;

a shielding disk having an ion beam passage hole at the center thereof interposed between said first and second electrostatic lens unit;

pair of end disks having an ion beam passage hole at the center thereof disposed at both ends of said cylindrical casing;

a first common supporting rod supporting said respective first electrodes for said first and second electrostatic lens unit along a first straight line while electrically insulating each other;

a second common supporting rod supporting said respective second electrodes for said first and second electrostatic lens unit along a second straight line while electrically insulating each other;

a third common supporting rod supporting said respective third electrodes for said first and second electrostatic lens unit along a third straight line while electrically insulating each other; and a fourth common supporting rod supporting said respective fourth electrodes for said first and second electrostatic lens unit along a fourth straight line while electrically insulating each other; said first, second, third and fourth common supporting rod are supported by said pair of end disks.

2. An electrostatic lens arrangement of multi-stages of multi-pole electrodes according to claim 1, wherein said first, second, third and fourth common supporting rod are made of an electrically insulating material and said respective first, second, third and fourth electrodes for said first and second electrostatic lens unit are supported by inserting said corresponding first, second, third and fourth common supporting rod through respective through holes formed along axial direction of said respective first, second, third and fourth electrodes.

3. An electrostatic lens arrangement of multi-stages of multi-pole electrodes according to claim 1, wherein said first, second, third and fourth common supporting rod are made of an electrically conductive metallic material and said respective first, second, third and fourth electrodes for said first and second electrostatic lens unit are supported by inserting said corresponding first, second, third and fourth common supporting rod through respective through holes formed along axial direction of said respective first, second, third and fourth electrodes via respective electrically insulating sleeves.

4. An electrostatic lens arrangement of multi-stages of multi-pole electrodes comprising:

a first electrostatic lens unit including a first, second, third and fourth electrode arranged around a circle surrounding a center axis of an ion beam passage with a same interval;

a second electrostatic lens unit including a first, second, third and fourth electrode arranged around the same circle surrounding the center axis of the ion beam passage with the same interval;

a third electrostatic lens unit including a first, second, third and fourth electrode arranged around the same circle surrounding the center axis of the ion beam passage with the same interval;

a cylindrical casing accommodating said first, second and third electrostatic lens unit in series;

a shielding disk having an ion beam passage hole at the center thereof interposed between said first and second electrostatic lens unit;

a further shielding disk having an ion beam passage hole at the center thereof interposed between said second and third electrostatic lens unit;

pair of end disks having an ion beam passage hole at the center thereof disposed at both ends of said cylindrical casing;

a first common supporting rod supporting said respective first electrodes for said first, second and third electrostatic lens unit along a first straight line while electrically insulating each other;

a second common supporting rod supporting said respective second electrodes for said first, second and third electrostatic lens unit along a second straight line while electrically insulating each other;

a third common supporting rod supporting said respective third electrodes for said first, second and third electrostatic lens unit along a third straight line while electrically insulating each other; and a fourth common supporting rod supporting said respective fourth electrodes for said first, second and third electrostatic lens unit along a fourth straight line while electrically insulating each other; said first, second, third and fourth common supporting rod are supported by said pair of end disks.

5. An electrostatic lens arrangement of multi-stages of multi-pole electrodes according to claim 4, wherein said first, second, third and fourth common supporting rod are made of an electrically insulating material and said respective first, second, third and fourth electrodes for said first, second and third electrostatic lens unit are supported by inserting said corresponding first, second, third and fourth common supporting rod through respective through holes formed along axial direction of said respective first, second, third and fourth electrodes.

6. An electrostatic lens arrangement of multi-stages of multi-pole electrodes according to claim 4, wherein said first, second, third and fourth common supporting rod are made of an electrically conductive metallic material and said respective first, second, third and fourth electrodes for said first, second and third electrostatic lens unit are supported by inserting said corresponding first, second, third and fourth common supporting rod through respective through holes formed along axial direction of said respective first, second, third and fourth electrodes via respective electrically insulating sleeves.

7. A mass spectrometer having an ion source, an electrostatic lens of multi-pole electrodes, a magnetic field section, an electric field section and an ion detector which are disposed along an ion beam passage, wherein said electrostatic lens of multi-pole electrodes is an electrostatic lens arrangement of multi-stages of multi-pole electrodes comprising:

a first electrostatic lens unit including a first, second, third and fourth electrode arranged around a circle surrounding a center axis of the ion beam passage with a same interval;

a second electrostatic lens unit including a first, second, third and fourth electrode arranged around the same circle surrounding the center axis of the ion beam passage with the same interval;

a cylindrical casing accommodating said first and second electrostatic lens unit in series;

a shielding disk having an ion beam passage hole at the center thereof interposed between said first and second electrostatic lens unit;

pair of end disks having an ion beam passage hole at the center thereof disposed at both ends of said cylindrical casing;

a first common supporting rod supporting said respective first electrodes for said first and second electrostatic lens unit along a first straight line while electrically insulating each other;

a second common supporting rod supporting said respective second electrodes for said first and second electrostatic lens unit along a second straight line while electrically insulating each other;

a third common supporting rod supporting said respective third electrodes for said first and second electrostatic lens unit along a third straight line while electrically insulating each other; and a fourth common supporting rod supporting said respective fourth electrodes for said first and second electrostatic lens unit along a fourth straight line while electrically insulating each other; said first, second, third and fourth common supporting rod are supported by said pair of end disks.

8. A tandem type mass spectrometer including a first mass spectrometer having an ion source, an electrostatic lens of multi-pole electrodes, a magnetic field section, an electric field section and a collector slit which are disposed along an ion beam passage, a second mass spectrometer having a source slit, an electrostatic lens of multi-pole electrodes, a magnetic field section, an electric field section, a detection slit and an ion detector which are disposed along the ion beam passage, and an interface element between said first and second mass spectrometer having an electrostatic lens of multi-pole electrodes and a bombardment chamber, wherein at least one of said electrostatic lenses of multi-pole electrodes is an electrostatic lens arrangement of multi-stages of multi-pole electrodes comprising:

a first electrostatic lens unit including a first, second, third and fourth electrode arranged around a circle surrounding a center axis of the ion beam passage with a same interval;

a second electrostatic lens unit including a first, second, third and fourth electrode arranged around the same circle surrounding the center axis of the ion beam passage with the same interval;

a cylindrical casing accommodating said first and second electrostatic lens unit in series;

a shielding disk having an ion beam passage hole at the center thereof interposed between said first and second electrostatic lens unit;

pair of end disks having an ion beam passage hole at the center thereof disposed at both ends of said cylindrical casing;

a first common supporting rod supporting said respective first electrodes for said first and second electrostatic lens unit along a first straight line while electrically insulating each other;

a second common supporting rod supporting said respective second electrodes for said first and second electrostatic lens unit along a second straight line while electrically insulating each other;

a third common supporting rod supporting said respective third electrodes for said first and second electrostatic lens unit along a third straight line while electrically insulating each other; and a fourth common supporting rod supporting said respective fourth electrodes for said first and second electrostatic lens unit along a fourth straight line while electrically insulating each other; said first, second, third and fourth common supporting rod are supported by said pair of end disks.

* * * * *